(12) United States Patent
Goh et al.

(10) Patent No.: US 11,264,315 B2
(45) Date of Patent: Mar. 1, 2022

(54) ELECTRONIC PACKAGE WITH PASSIVE COMPONENT BETWEEN SUBSTRATES

(71) Applicant: Intel Corporation, Santa Clara, CA (US)

(72) Inventors: Eng Huat Goh, Penang (MY); Min Suet Lim, Simpang Ampat (MY); Jiun Hann Sir, Gelugor (MY); Hoay Tien Teoh, Paya Terubong (MY); Jimmy Huat Since Huang, Georgetown (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/845,531

(22) Filed: Dec. 18, 2017

(65) Prior Publication Data

US 2019/0103346 A1 Apr. 4, 2019

(30) Foreign Application Priority Data

Sep. 29, 2017 (MY) .......................... PI 2017703697

(51) Int. Cl.
*H01L 23/498* (2006.01)
*H05K 1/18* (2006.01)
(Continued)

(52) U.S. Cl.
CPC ...... *H01L 23/49816* (2013.01); *H01L 21/563* (2013.01); *H01L 23/49827* (2013.01);
(Continued)

(58) Field of Classification Search
CPC ......... H01L 23/49816; H01L 23/49827; H01L 21/563; H01L 23/5223; H01L 23/5227; H01L 24/14; H01L 23/5389; H01L 23/3128; H01L 2924/00014; H01L 24/16; H01L 2924/19106; H01L 2924/15311; H01L 2224/16225; H01L 23/50;
(Continued)

(56) References Cited

U.S. PATENT DOCUMENTS

2003/0042587 A1 * 3/2003 Lee ..................... H01L 25/0657
257/678
2008/0116589 A1 * 5/2008 Li ......................... H01L 21/563
257/780
(Continued)

*Primary Examiner* — Benjamin Tzu-Hung Liu
(74) *Attorney, Agent, or Firm* — Schwegman Lundberg & Woessner, P.A.

(57) ABSTRACT

An electronic package with passive components located between a first substrate and a second substrate. The electronic package can include a first substrate including a device interface for communication with an electronic device. An interposer can be electrically coupled to the first substrate. A second substrate can be offset from the first substrate at a distance. The second substrate can be electrically coupled to the first substrate through the interposer. A passive component can be attached to one of the first substrate or the second substrate. The passive component can be located between the first substrate and the second substrate. A height of the passive component can be is less than the distance between the first substrate and the second substrate. The second substrate can include a die interface configured for communication with a die. The die interface can be communicatively coupled to the passive component.

11 Claims, 6 Drawing Sheets

(51) Int. Cl.
*H01L 21/56* (2006.01)
*H01L 23/522* (2006.01)
*H01L 23/00* (2006.01)
*H01L 23/538* (2006.01)
*H01L 23/31* (2006.01)
*H05K 3/34* (2006.01)

(52) U.S. Cl.
CPC ...... *H01L 23/5223* (2013.01); *H01L 23/5227* (2013.01); *H01L 23/5389* (2013.01); *H01L 24/14* (2013.01); *H05K 1/181* (2013.01); *H05K 1/188* (2013.01); *H01L 23/3128* (2013.01); *H01L 24/16* (2013.01); *H01L 2224/16225* (2013.01); *H01L 2924/00014* (2013.01); *H01L 2924/15311* (2013.01); *H01L 2924/19106* (2013.01); *H05K 3/3436* (2013.01); *H05K 2201/1053* (2013.01); *H05K 2201/10515* (2013.01)

(58) Field of Classification Search
CPC ........ H01L 23/49822; H01L 23/49833; H05K 1/181; H05K 1/188; H05K 2201/10515; H05K 3/3436; H05K 2201/1053; Y02P 70/50
See application file for complete search history.

(56) References Cited

U.S. PATENT DOCUMENTS

| | | | |
|---|---|---|---|
| 2011/0140268 A1* | 6/2011 | Cheah | H05K 1/111 257/737 |
| 2014/0035097 A1* | 2/2014 | Lin | H01L 23/552 257/531 |
| 2017/0064837 A1* | 3/2017 | Li | H01L 21/4857 |
| 2018/0175002 A1* | 6/2018 | Loo | H01L 25/0655 |

* cited by examiner

ELECTRONIC PACKAGE WITH PASSIVE COMPONENT BETWEEN SUBSTRATES

PRIORITY APPLICATION

This application claims the benefit of priority to Malaysian Application Serial Number PI 2017703697, filed Sep. 29, 2017, which is incorporated herein by reference in its entirety.

TECHNICAL FIELD

This document pertains generally, but not by way of limitation, to electronic packaging.

BACKGROUND

Electronic packages, such as microchip packages or processor packages are often used with voltage regulation circuits. The voltage regulation circuit can provide power to the electronic package, such as power that is within the operating parameters of the particular electronic package. Sometimes voltage regulation circuits are included in an electronic device to which the electronic package is attached to. For instance, the voltage regulator circuit can be located on a mother board of the electronic device for regulating power to the electronic package.

In some instances, electronic packages include integrated voltage regulators (IVRs). The IVR can include voltage regulation circuitry and components that are incorporated into the electronic package. For instance, the electronic package can include the voltage regulation circuit on a substrate of the electronic package, such as on an upper surface (die side) or a lower surface (land side) of an electronic package. Where the IVR is placed on the land side of the electronic package, the size or pitch of the electrical contacts (E.g., BGA) can be increased to provide clearance between the IVR components and the motherboard. Optionally, a recess might be provided in the motherboard to provide clearance between the IVR and the motherboard.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present application relates to devices and techniques for decreasing the overall height and increasing communication speed with a die of an electronic package, such as an electronic package having an integrated voltage regulator (IVR). The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass all available equivalents of those claims.

The present inventors have recognized, among other technical challenges, that placing voltage regulation components (e.g., passive components), such as an IVR, on the land side of an electronic package can occupy space that could otherwise be used for electrical contacts for communicatively coupling the electronic package to the electronic device. In some examples, the size (e.g., length, width, or height) of the electronic package can be increased to provide space for the electrical contacts. For instance, the voltage regulation components can be located in a center portion of the land side of the substrate. The electrical contacts can be located between the voltage regulation components and the sides (e.g., edges) of the substrate. In some instances, the length or width of the electronic package, or both, are increased to provide space for locating the voltage regulation components on the land side of the electronic package.

In some examples, the height of the electrical contacts can be 0.25 mm (at 0.65 mm pitch) to provide clearance for the voltage regulation components, which can have a height of 0.22 mm or higher. Where a smaller pitch for the electrical contacts is used, for example 0.15 mm (at 0.40 mm pitch), the mother board can be provided with a cavity to accommodate the height of the passive components. Alternatively, smaller passive components can be used; however, performance of the smaller passive components can be reduced corresponding to the size reduction.

The present subject matter can reduce the size of the electronic package having at least one passive component, such as a passive component for an IVR, and remove the cavity from the motherboard of an electronic device. For example, locating a passive component between a first substrate and a second substrate of an electronic package can reduce the size of the electronic package without the addition of a cavity to the motherboard. The substrate of the electronic package can include electrical contacts from a first side to a second side, or in a central portion, or along the substantial entirety of the substrate.

In one example, an electronic package can include passive components located between a first substrate and a second substrate. The electronic package can include a first substrate including a device interface for communication with an electronic device. An interposer can be electrically coupled to the first substrate. A second substrate can be offset from the first substrate at a distance. The second substrate can be electrically coupled to the first substrate through the interposer. A passive component can be attached to one of the first substrate or the second substrate. The passive component can be located between the first substrate and the second substrate. A height of the passive component can be is less than the distance between the first substrate and the second substrate. The second substrate can include a die interface configured for communication with a die. The die interface can be communicatively coupled to the passive component.

Accordingly, the first side of the electronic package (e.g., the first side of the first substrate) can be free of passive components, increasing the area available for the placement of electrical contacts or for reducing the size of the electronic package. For instance, electrical contacts can be placed along the entire first surface of the first package as previously mentioned. In some instances, the height of the electrical contacts can be reduced because the passive components are not located on the first side of the first substrate (land side of the electronic package). Thus, a distance between the electronic device and the electronic package can be decreased, and correspondingly, the overall height of the electronic package can be decreased. Where the passive components are located between the first substrate and the second substrate, the size and number of passive components can be increased as compared to the size and number of passive components located between the electronic package and the motherboard. Thus, the performance of the passive components can be increased corresponding to the size and number of the passive components. For instance, the performance of the passive components can be proportional to their respective size and number.

Figure 1:
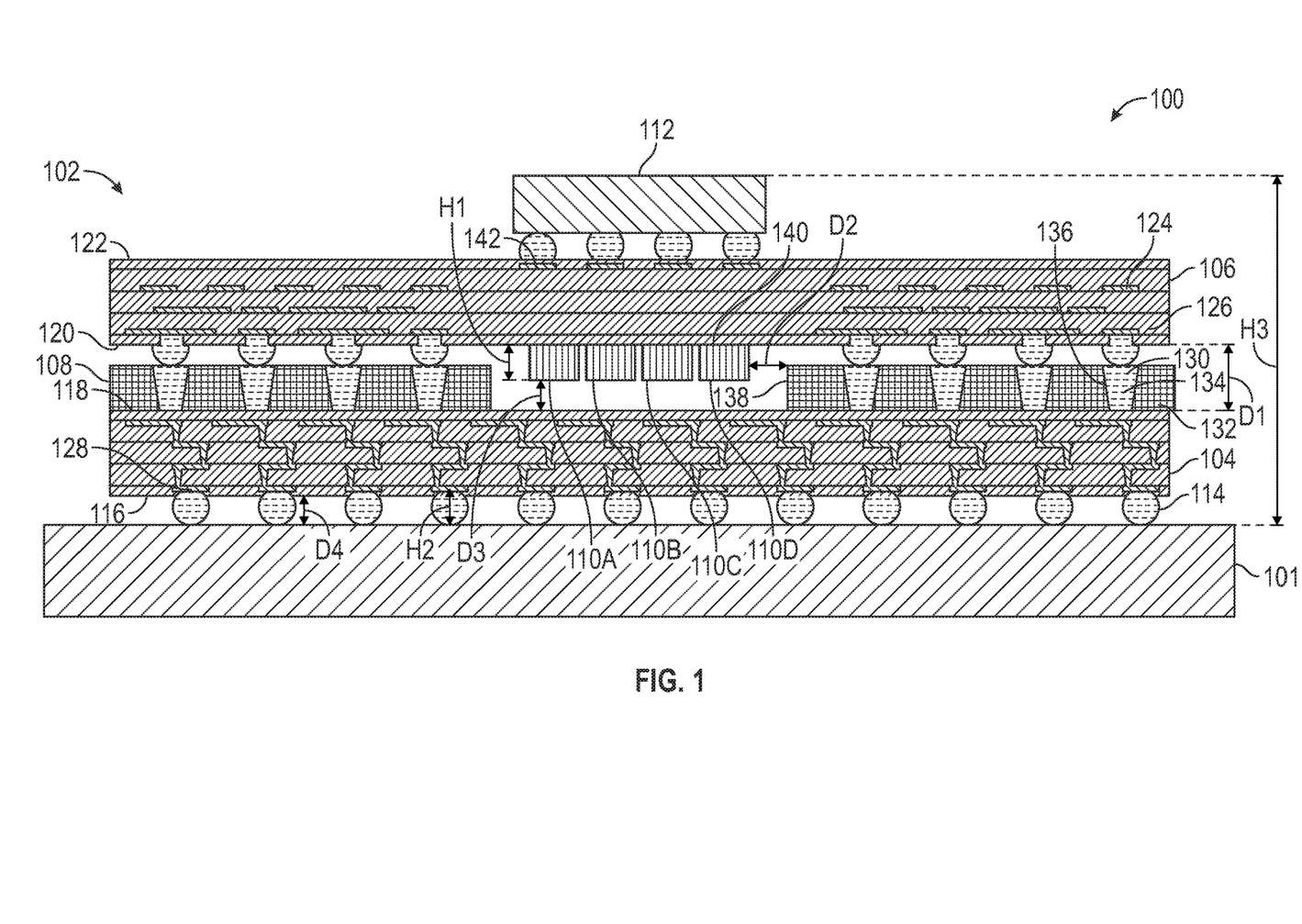
FIG. 1 illustrates an example of a cross section of an electronic package communicatively coupled to an electronic device, the electronic package including passive components located between a first substrate and a second substrate, according to an embodiment.

FIG. 1 illustrates a cross section of an example of an electronic package communicatively coupled to an electronic device, the electronic package including passive components located between a first substrate and a second substrate. The electronic device 100 can include an electronic package 102 and a circuit board 101 (e.g., motherboard) for coupling to the electronic package 102. The electronic device 100 can include, but is not limited to, a computer, such as a personal computer, server, controller, internet-of-things device, or the like.

The electronic package 102 can include at least two substrates (e.g., a first substrate 104 and a second substrate 106), an interposer 108, and at least one passive component (e.g., passive components 110A-D). The interposer 108 can be electrically coupled to the first substrate 104. The second substrate 106 can be offset from the first substrate 104 at a distance D1 and electrically coupled to the first substrate 104 through the interposer 108. The passive component can be attached to one of the first substrate 104 or the second substrate 106 and located between the first substrate 104 and the second substrate 106, wherein the passive component has a height H1 that is less than the distance D1 between the first substrate 104 and the second substrate 106. In some examples, the electronic package 102 can include a die 112. For instance, in the example of FIG. 1, the die 112 can be communicatively coupled to the second substrate 106. The electronic package 102 can be communicatively coupled to the electronic device 100 with at least one electrical contact 114. At least one electrical contact 114 can be coupled to the electronic package 102 (e.g., a device interface 128 of the first substrate 104) for communicating between the electronic package 102 and the electronic device 100. By locating the passive component between the first substrate 104 and the second substrate 106, the size of the electronic package 102 can be reduced and the performance of the at least one passive component can be increased.

The substrate, such as the first substrate 104 and the second substrate 106, can include respective first surfaces and second surfaces. For instance, the first substrate 104 can include a first surface 116 and a second surface 118 and the second substrate 106 can includes a first surface 120 and a second surface 122. In an example, the respective first surfaces 116, 120 can be a lower side and the respective second surfaces 118, 122 can be an upper side. The substrate can include a single or multi-layer substrate with one or more routing layers 124. For instance, the first substrate 104 or second substrate 106 can include one or more alternating layers of dielectric 126 and conductive materials. The conductive layers (e.g., routing layers 124) can be communicatively coupled, such as through one or more vias (including plated through-holes or blind vias). In various examples, the substrate, such as the first substrate 104 and the second substrate 106, can be buildup layers. In further examples, the first substrate 104 or the second substrate 106 can be coreless substrates. In some examples, one or more stiffeners (e.g., shown in FIG. 3) can be coupled to the first substrate 104 or the second substrate 106 to provide structural support.

The substrate can communicate electrical signals through the at least one routing layer 124 between the various components of the electronic package 102, such as the die 112, the passive component, the electrical contacts (e.g., electrical contact 114), the interposer 108, or other components of the electronic package 102. The first substrate 104 and the second substrate 106 can also communicate electrical signals between the electronic package 102 and the electronic device 100 through one or more electrical contacts 114. For instance, the electrical contacts 114 can be located on a first side of the first substrate 104.

Figure 2:
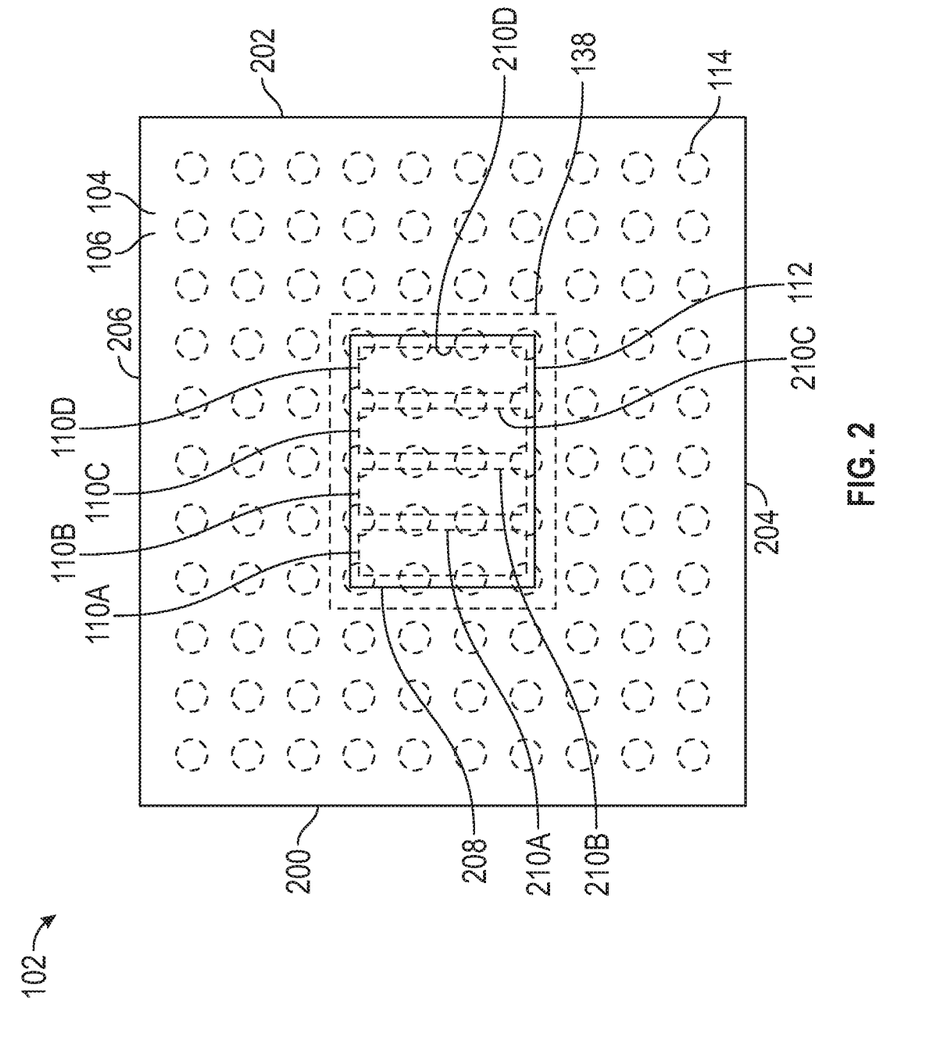
FIG. 2 is a top view of an electronic package 102 with a plurality of electrical contacts located subjacent to a plurality of passive components and a die, according to an embodiment.

The electrical contacts 114 can be communicatively coupled to one or more routing layers 124 of the substrate (e.g., first substrate 104 or second substrate 106) through the device interface 128. The device interface 128 can include, but is not limited to, a solder pad, plated through hole, ball grid array (BGA) pads, or other interface for electrical communication between the electronic package 102 and the electronic device 100. In various examples, the device interface 128 can be located along a substantial entirety of a surface of the first substrate 104. Are arranged in a pattern spanning/occupying the surface from a first side to a second side and from a third side to a fourth side (as shown in the example of FIG. 2 and described herein).

The interposer 108 can include at least one electrical connection 130 for providing electrical communication from a first surface of the interposer 108 to a second surface of the interposer 108. As shown in the example of FIG. 1, the interposer 108 can include a mold 132 and at least one through-mold via 134. For instance, the mold 132 can include a polymer or other dielectric material having at least one passage 136 extending from the first surface to the second surface. In various examples the mold 132 can include mold compound, such as epoxy resin or a polymer material. In some examples, the mold 132 can include a filler material, for instance, to increase temperature stability or strength. In an example, the mold 132 can be pressured molded onto the substrate, such as the second surface 118 of the substrate 104. For instance, the mold 132 can include a flow structure from the molding process.

A conductive material can be located within the at least one passage 136 to form a through-mold via 134. For instance, the conductive material can be plated within the one or more passages 136 of the mold 132. In a further example, the conductive material can be plated onto the substrate (e.g., a conductive pad or electrical interface of the substrate). In the example of FIG. 1, the interposer 108 can include a plurality of electrical connections 130 (e.g., through-mold vias 134). The interposer 108 can be electrically coupled between substrates, such as between the first substrate 104 and the second substrate 106. For instance, in an example, the interposer 108 can be located between the first substrate 104 and the second substrate 106. Accordingly, the first substrate 104 can be located at the distance D1 from the second substrate 106. For instance, in some examples, the distance D1 can be based on a thickness of the interposer 108.

In the example of FIG. 1, the interposer 108 can be coupled to the second surface 118 of the first substrate 104 and the first surface 120 of the second substrate 106. For instance, the interposer 108 can be electrically coupled (e.g., plated) on to one or more routing layers 124 of the first substrate 104 and soldered to one or more routing layers 124 of the second substrate 106. Accordingly, the interposer 108 can be electrically coupled to the first substrate 104 and the second substrate 106. In a further example, the interposer 108 is a printed circuit board (PCB) having a plurality of electrical connections 130 (e.g., vias, such as plated through holes) electrically coupling the second substrate 106 to the first substrate 104. In various examples, the interposer 108 can include an aperture 138. The passive component can be located within the aperture 138 of the interposer 108. For instance, the interposer 108 can be located between the passive component and one or more sides (e.g., sides 200-206 as shown in FIG. 2) of the first substrate 104 or the second substrate 106.

The passive component (e.g., passive components 110A-D in the example of FIG. 1) can be located between the first substrate 104 and the second substrate 106. For instance, the passive component can be electrically coupled to the first substrate or the second substrate 106 and attached, such as directly attached, to the first substrate 104 or the second substrate 106. In the example, of FIG. 1, the passive component can be attached and electrically coupled to the second substrate 106, such as the first surface 120 of the second substrate 106. For instance, the passive component can be directly attached to the second substrate 106 and not directly attached to the first substrate 104. As used herein, direct attachment or directly coupled refers to coupling a component to another component without an intermediate component (a joining element, such as adhesive, solder, or fastener are not considered intermediate components). In other words, if the passive component is soldered to a substrate, it is considered directly attached according to this disclosure. For instance, the passive component can be soldered to the first substrate 104 or the second substrate 106.

The passive component can include, but is not limited to, a capacitor, inductor, or resistor. In an example, the passive component can be a magnetic inductor array. In some examples, the passive component can be a surface mount component. For instance, the passive component can include a first lead and a second lead, and both the first and the second leads are attached to the first substrate 104 or the second substrate 106. The passive component can be located within the aperture 138 extending through the interposer 108. In some examples, the aperture 138 can be a cavity within the interposer 108 that does not extend through the thickness of the interposer 108. The passive component can have a height H1 that is less than the distance D1 between the first substrate 104 and the second substrate 106.

In various examples, such as the example of FIG. 1, the passive component can be located at a distance D2 from the interposer 108 and at a distance D3 from the first substrate 104 or the second substrate 106. In other words, the passive component is attached to one substrate (e.g., the second substrate 106) and located at the distance D3 from the opposing substrate (e.g., the first substrate 104). As shown in the example of FIG. 1, the passive component is attached to the second substrate 106 and located at the distance D3 from the first substrate 104. Accordingly, the passive component has clearance (e.g., distance D3) to the opposing substrate. For instance, the passive component can be separated from the first substrate 104, the second substrate 106, the interposer 108, or any combination thereof by an air gap (e.g., distance D2 or D3).

In an example, the passive component can be located on an opposing side of a substrate from the die 112. For instance, if the die 112 is located on the second surface 122 of the second substrate 106, the passive component can be located on the first surface 120 of the second substrate 106. Locating the die 112 on the opposing surface of the substrate can reduce the length of the routing layer 124 between the passive component and the die 112. Accordingly, the speed and efficiency of electrical communication between the passive component and the die 112 can be increased. By locating the passive component between the first substrate 104 and the second substrate 106, the size and number of passive components, such as passive components 110A-D, can be increased. For example, the performance of many passive components corresponds to their size. The size and number of the passive components located between the first substrate 104 and the second substrate 106 are not restricted by the size and number of the electrical contacts 114. Thus, the performance of the passive components of the electronic package 102 can be increased corresponding to the size and number of the passive components included between the first substrate 104 and the second substrate 106.

In a further example, at least one passive component (e.g., passive components 110A-D) can be configured into an integrated voltage regulator (IVR) 140, such as an IVR circuit. In other words, the electronic package 102 can include the IVR 140 having one or more of the passive components, such as passive components 110A-D, located between the first substrate 104 and the second substrate 106. The IVR 140 can regulate the power, voltage, or current received by the die 112. In some examples, the IVR 140 can be located on an opposing side of a substrate from the die 112 (as previously described with regard to the passive component). For instance, if the die 112 is located on a second surface 122 of the second substrate 106, at least a portion of the IVR 140 can be located on the first surface 120 of the second substrate 106. Accordingly, the speed and efficiency (e.g., reduced power loss) of electrical communication between the IVR 140 and the die 112 can be increased.

The at least one electrical contact 114 can include, but is not limited to, a solder ball, BGA, C4 interface, second level interconnect (SLI), pin grid array (PGA), land grid array (LGA), or other electrical communication interface. The electrical contact 114 can be located between the electronic device 100 (e.g., the circuit board 101) and the electronic package 102, such as the first surface 116 of the first substrate 104 as shown in the example of FIG. 1. For instance, one or more electrical contacts 114 can communicatively couple the electronic package 102 to the electronic device 100. In an example, the electrical contact 114 can be electrically coupled to one or more device interfaces 128 and accordingly one or more routing layers 124 within the substrate, such as the first substrate 104 or second substrate 106.

Where the passive component (e.g., passive components 110A-D) are located between the first substrate 104 and the second substrate 106 and, for instance, not along the first surface of the first substrate 104 (e.g., between the first surface 116 of the first substrate and the electronic device 100), the electronic package 102 can be located closer to the electronic device 100. For instance, a distance D4 between the electronic package 102 and the electronic device 100 can be less than a height H1 of the passive component. In various examples, the pitch or size of the electrical contact 114 can be decreased because the passive component is located between the first substrate 104 and the second substrate 106 and not between the first surface 116 of the first substrate 104 and the electronic device 100. In an example, the electrical contact 114 can include a height H2 of 0.15 mm or less. Accordingly, an overall height H3 of the electronic package 102, for example when coupled to the electronic device 100, can be decreased.

The die 112 can include, but is not limited to a processor, memory, or other microprocessor or semiconductor chip. The die 112 can be electrically and mechanically coupled to the first substrate 104 or the second substrate 106. For instance, the die 112 can be communicatively coupled to a die interface 142 of the substrate, such as the second substrate 106 in the example of FIG. 1. The die interface 142 can include, but is not limited to, a solder pad, plated through hole, BGA pads, or other interface for electrical communication between the electronic package 102 and the die 112. The die interface 142 can be electrically coupled to one or more routing layers 124 of the first substrate 104 or the second substrate 106. Accordingly, the die 112 can be communicatively coupled to the electronic package 102.

FIG. 2 is a top view of an electronic package, such as electronic package 102. In the example of FIG. 2, the electronic package 102 includes a plurality of the electrical contacts 114 located subjacent to the passive components 110A-D and the die 112. The substrate, e.g., substrate 104 or substrate 106 (as shown in FIG. 2) can include a plurality of sides. For example, where the substrate is rectangular, the substrate can include a first 200, second 202, third 204, and fourth 206 respective sides corresponding to the left, right, front, and back sides. In further examples, the substrate can be non-rectangular, circular, or other shapes. In these examples, the plurality of sides (e.g., first 200, second 202, third 204, and fourth 206) can correspond to respective polar coordinates of the substrate (e.g., along an X, Y, or Z axis of the substrate).

As previously described, the interposer 108 can include an aperture, such as the aperture 138 (shown in hidden line in the example of FIG. 2). The passive component, such as passive components 110A-D (also shown in hidden line in the example of FIG. 2), can be located within the aperture 138 of the interposer 108. For instance, the interposer 108 can be located between the passive component and one or more sides of the first or second substrate 106.

In an example, the plurality of electrical contacts 114 can be located from the first side 200 to the second side 202 of the first substrate 104. For instance, in some examples, the plurality of electrical contacts 114 can be arranged in a pattern (e.g., grid or diagonal arrangement) along the substrate from the first side 200 to the second side 202 and from the third side 204 to the fourth side 206. In an example, the plurality of electrical contacts 114 can be located along a substantial entirety of the first surface 116, 120 or the second surface 118, 122 of the respective first substrate 104 or the second substrate 106. For instance, the pattern of electrical contacts can be continuous (e.g., uninterrupted) along the substrate.

In a further example as shown in FIG. 2, one or more contacts of the plurality of electrical contacts 114 can be located, among other places, within a central area of the substrate, such as the first surface 116 of the first substrate 104. For instance, the central area can include, but is not limited to, an area in the center 50% of the first surface 116 of the first substrate 104. In a further example, one or more electrical contacts 114 (shown in hidden line in the example of FIG. 2) of the plurality of electrical contacts 114 are located subjacent to the die 112, the passive component (e.g., one or more of passive components 110A-D), or a combination thereof. For instance, one or more of the plurality of contacts 114 can be located entirely subjacent to the die 112 or the passive component. In various examples, a plurality of electrical contacts 114 can be located subjacent to the die 112 or the passive component. As used herein subjacent refers to within a projection of a periphery 208 of the die 112 or a periphery 210A-D of the passive component and directly above or below the die 112 or passive component. In various examples, at least one of the electrical contacts 114 can be located between the die 112 and the circuit board 101 (e.g., motherboard) of the electrical device 100.

The device interface 128 side of the electronic package 102 (E.g., the first side 116 of the first substrate 104) can be free of passive components. For instance, by locating the one or more passive components between the first substrate 104 and the second substrate 106. Accordingly, an area available for the placement of electrical contacts 114 can be increased or the size (e.g., area of the first surface 116) can be decreased reducing the overall size of the electronic package 102. The second surface 122 of the second substrate can be used for other components, such as one or more dies 112, further passive components, heatsinks, or other electronic components.

Figure 3:
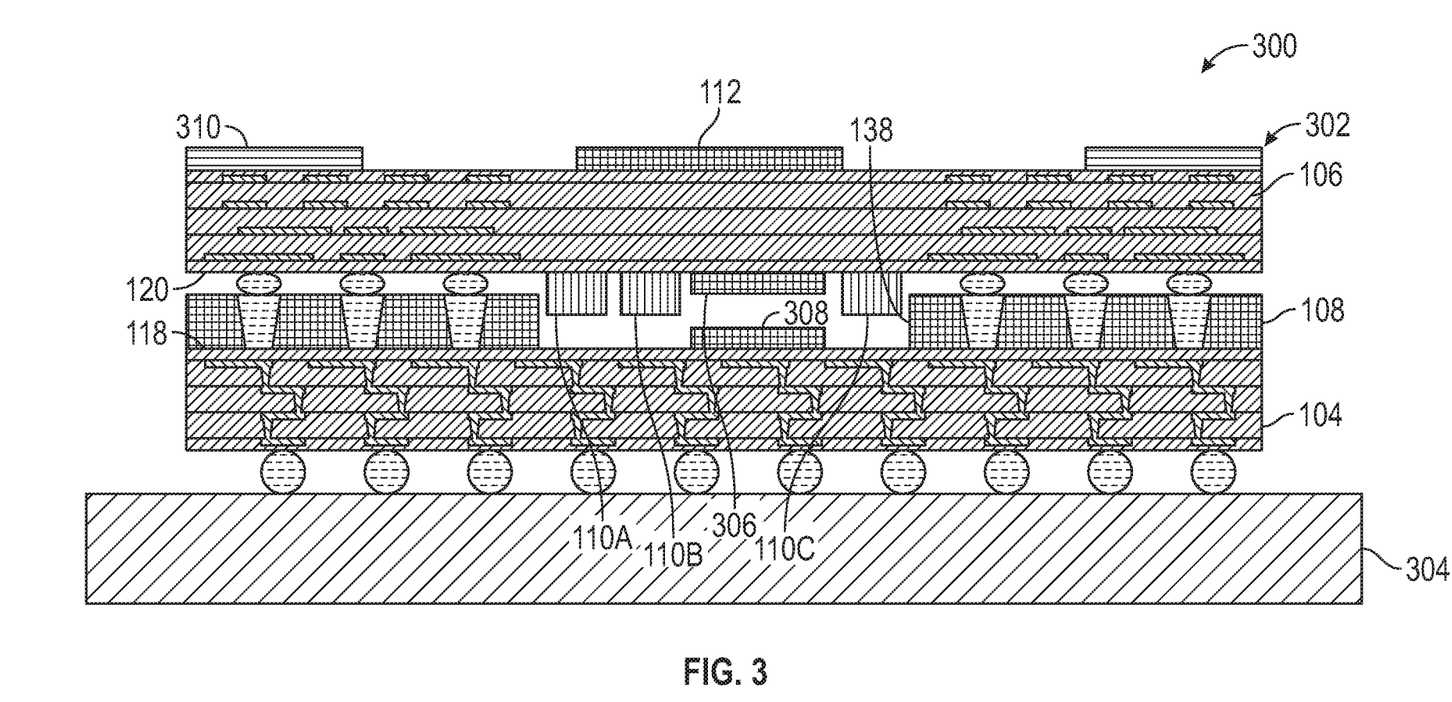
FIG. 3 illustrates an example of an electronic package with a passive component and a plurality of dies located between a first substrate and a second substrate, according to an embodiment.

FIG. 3 illustrates an example of an electronic device 300 including an electronic package 302 with at least one passive component (e.g., 110A-C) and a plurality of dies, such as a second die 306 or a third die 308, located between a first substrate and a second substrate, such as the first substrate 104 and the second substrate 106. For instance, the second die 306 can be electrically coupled and directly attached (e.g., mechanically attached) to a first surface (e.g., the first surface 120) of the second substrate 106. As shown in the example of FIG. 3, the second die 306 can be located within an aperture, such as the aperture 138 of the interposer 108. In a further example, the second die can be located on a second surface, for instance, the second surface 118 of the first package 104. In various examples, the substrate, such as the first substrate 104 and the second substrate 106 can be buildup layers (e.g., coreless buildup layers). The electronic package (e.g., electronic package 302 can include one or more stiffeners 310 to provide structural support.

Where the electronic package 302 includes the third die 308, the third die 308 can be electrically coupled and directly attached to the second surface 118 of the first package 104. In the example shown in FIG. 3, the electronic package 302 can include the first die 112 and at least one passive component (e.g., passive components 110A-C), the second die 306, and the third die 308 located between the first substrate 104 and the second substrate 106. Accordingly, the first surface 116 of the first substrate 104 can include a plurality of electrical contacts 114 located between the first side (e.g., 200) and the second side (e.g., 202), or between the third die (e.g., 204) and the fourth side (e.g., 206), or within the center portion of the first surface 116, or along a substantial entirety of a surface (e.g., first surface 116) of the first substrate 104, or any combination thereof. As previously discussed, the plurality of electrical contacts 114 can communicatively couple the electronic package 302 to the circuit board 304 of the electronic device 300.

Figure 4:
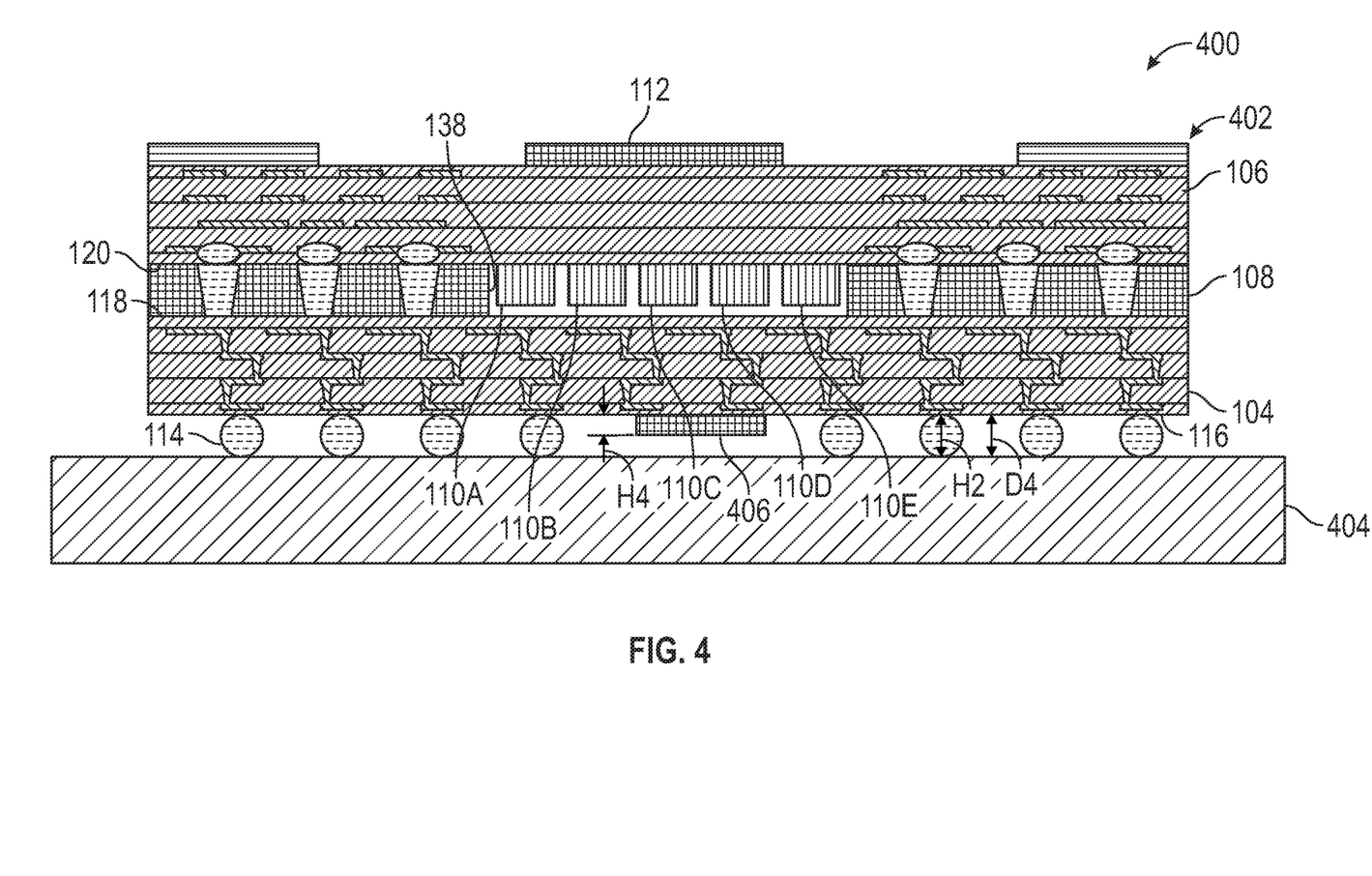
FIG. 4 depicts an example of an electronic package with a passive component located between a first substrate and a second substrate as well as a die and a plurality of electrical contacts located on a first surface of the first substrate, according to an embodiment.

FIG. 4 depicts an example of an electronic device 400 including an electronic package 402 with at least one passive component (e.g., one or more passive components 10A-E) located between a first substrate and a second substrate (e.g., first substrate 104 and second substrate 106). In the example of FIG. 4, the electronic package 402 can include a first die, such as the die 112, and a second die (e.g., second die 406). The second die 406 and the plurality of electrical contacts 114 can be located on the first surface 116 of the first substrate 104. For instance, one or more of the plurality of electrical contacts 114 can be located between the second die 406 and one or more sides (e.g., sides 200, 202, 204, or 206) of the substrate, such as the first substrate 104. In some examples, the second die 406 can include a height H4 that is less than the distance D4 (between the first surface 116 of the first substrate 104 and a circuit board 404 (e.g., similar to the circuit board 101)). The height H2 of the one or more electrical contacts 114 can be less than the height of the passive component (e.g., passive components 110A-E). Accordingly, the height H2 of the electrical contacts 114, and correspondingly, the overall height of the electronic package 402 can be reduced, for instance, by locating the one or more passive components 110A-E between the first substrate 104 and the second substrate 106. The second die 406 can be positioned in the space (E.g., distance D4) between the first surface 116 and the circuit board 404.

Figure 5:
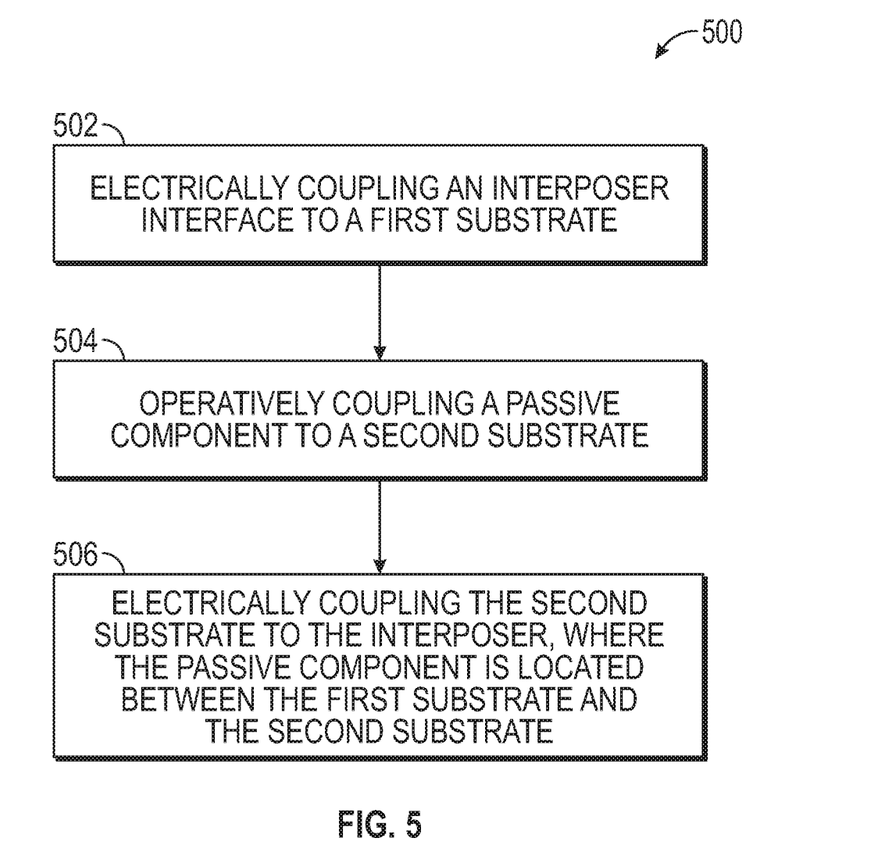
FIG. 5 is block diagram of an exemplary technique for making an electronic package with passive components located between a first substrate and a second substrate, according to an embodiment.

FIG. 5 is an example of a method 500 for making an electronic package (e.g., electronic package 102, 302, or 402) with passive components located in a mid-layer as previously described in the examples herein and shown for instance in FIGS. 1-4. In describing the method 500, reference is made to one or more components, features, functions, and processes previously described herein. Where convenient, reference is made to the components, features, processes and the like with reference numerals. Reference numerals provided are exemplary and are nonexclusive. For instance, features, components, functions, processes, and the like described in the method 500 include, but are not limited to, the corresponding numbered elements provided herein. Other corresponding features described herein (both numbered and unnumbered) as well as their equivalents are also considered.

At 502, an interposer can be electrically coupled to a first substrate. The first substrate can be configured for communication with an electronic device. In some examples, electrically coupling the interposer to the first substrate can include forming a mold and a plurality of through-mold vias. For instance, a mold can be disposed on the first substrate. A plurality of passages can be formed through the mold from a first surface attached to the first substrate to a second surface on an opposing side of the mold. In an example, the plurality of passages can be drilled, such as laser drilled. A conductive material (e.g., copper, solder, silver, or the like) can be disposed within the plurality of passages. The conductive material can be an electrical connection configured for electrical communication. In a further example, a printed circuit board interposer can be attached to the first substrate. The printed circuit board interposer can include a plurality of electrical connections configured for electrical communication between the first substrate and the second substrate.

At 504, a passive component can be operatively coupled to a second substrate. The passive component can include a height as previously described herein. In an example, the passive component can be coupled to a substrate, such as the second substrate. For instance, the passive component can be soldered to the second substrate. In a further example, the passive component can be directly coupled to one substrate (e.g. the second substrate) and not directly coupled (isolated from direct contact) with an opposing substrate (e.g., the first substrate). Because the passive component (e.g., a surface mount component) can be placed on and electrically coupled (e.g., soldered using a reflow oven) to the first or second substrates (e.g., using a pick and place machine), the time and cost to manufacture the electronic package can be decreased.

An IVR (e.g., IVR circuit) can be constructed including one or more of the passive components. In a further example, an air core inductor can be located within the first substrate or the second substrate. For instance, the air core inductor can be fabricated within the routing layers of the first substrate or the second substrate. Accordingly, the air core inductor can be included in a IVR circuit.

At 506, the second substrate can be electrically coupled to the interposer. In an example, the passive component can be located between the first substrate and the second substrate. The second substrate can be located at a distance from the first substrate and the height of the passive component can be less than the distance. In an example, electrically coupling the second substrate to the interposer can include locating the passive component within an aperture extending through the interposer. For instance, an air gap can be provided between the passive component and the first substrate or between the passive component and the interposer.

The method 500 can further include fabricating a plurality of die interfaces for communicatively coupling a die to the second substrate. At least one routing layer can communicatively couple the one or more die interfaces to the passive component. In a further example, a second die interface can be located on the second surface of the first substrate, the second surface of the first substrate, or the first surface of the second substrate, or any combination thereof.

Figure 6:
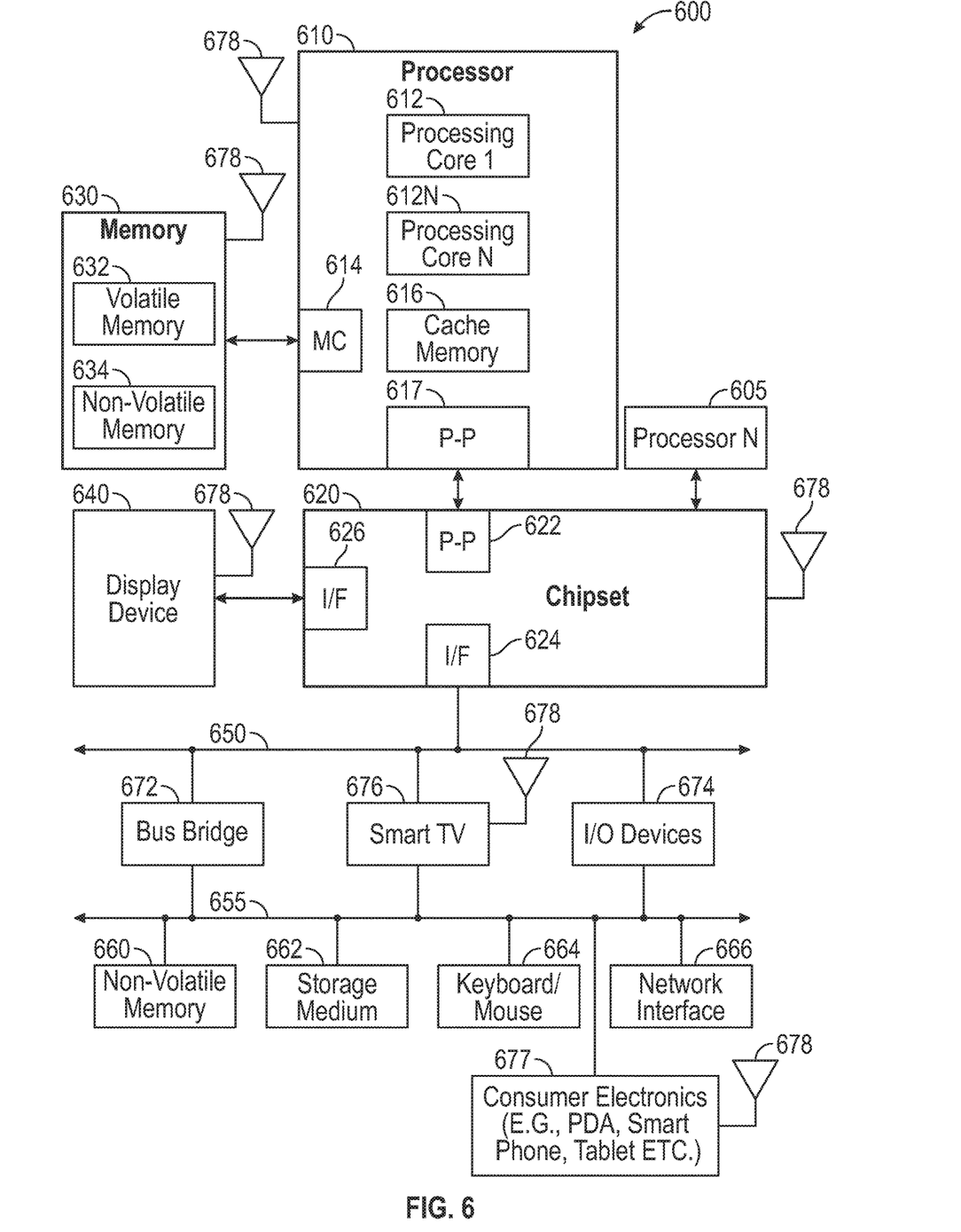
FIG. 6 is block diagram of an exemplary electronic device including an electronic package, according to an embodiment.

FIG. 6 is a block diagram illustrating an example machine 600 (e.g., electronic device 100, 300, or 400) upon which any one or more of the devices (e.g., electronic packages 102, 302, or 402) or techniques (e.g., methods, such as method 500) discussed herein may perform. In alternative embodiments, the machine 600 may operate as a standalone electronic device or may be connected (e.g., networked) to other machines. The machine 600 (e.g., electronic device 100, 300, or 400) may be a personal computer (PC), a tablet PC, a set-top box (STB), a Personal Digital Assistant (PDA), a mobile telephone, a web appliance, a network router, switch or bridge, watch, smartwatch, smart home system, internet-of-things device, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The machine (e.g., computer, or computer system) 600 may include a hardware processor 602 (e.g., a CPU, GPU, a hardware processor core, or any combination thereof), a main memory 604, and a static memory 606, some or all of which may communicate with each other via an interlink (e.g., bus) 608. The machine 600 may further include a display device 610, an alphanumeric input device 612 (e.g., a keyboard), and a user interface (UI) navigation device 614 (e.g., a mouse). In an example, the display device 610, input device 612 and UI navigation device 614 may be a touch screen display. The machine 600 may additionally include a mass storage device (e.g., drive unit) 616, a signal generation device 618 (e.g., a speaker), a network interface device 620, and one or more sensors 621, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR)) connection to communicate or control one or more peripheral devices (e.g., a printer, card reader, etc.).

The mass storage device 626 may include a machine readable medium 622 on which is stored one or more sets of data structures or instructions 624 (e.g., software) embodying or utilized by any one or more of the techniques or functions described herein. The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the mass storage device 616 may constitute machine readable media.

While the machine readable medium 622 is illustrated as a single medium, the term "machine readable medium" may include a single medium or multiple media (e.g., a centralized or distributed database, and/or associated caches and servers) that arranged to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having resting mass. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 may further be transmitted or received (e.g., transceived) over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMAX®), peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

Various Notes & Examples

Each of these non-limiting examples may stand on its own, or may be combined in various permutations or combinations with one or more of the other examples. To better illustrate the method and apparatuses disclosed herein, a non-limiting list of embodiments is provided here:

Example 1 is an electronic package with passive components located between a first substrate and a second substrate, the electronic package comprising: a first substrate including a device interface for communication with an electronic device; an interposer electrically coupled to the first substrate; a second substrate offset from the first substrate at a distance and electrically coupled to the first substrate through the interposer; a passive component attached to one of the first substrate or the second substrate and located between the first substrate and the second substrate, wherein the passive component has a height that is less than the distance between the first substrate and the second substrate; and a die interface attached to the second substrate and communicatively coupled to the passive component, wherein the die interface is configured for communication with a die.

In Example 2, the subject matter of Example 1 optionally includes a plurality of electrical contacts coupled to the device interface for communicating between the first substrate and the electronic device.

In Example 3, the subject matter of Example 2 optionally includes wherein one or more contacts of the plurality of electrical contacts are located subjacent to the passive component.

In Example 4, the subject matter of any one or more of Examples 2-3 optionally include wherein the plurality of electrical contacts are located from a first side to the second side of the first substrate.

In Example 5, the subject matter of any one or more of Examples 1-4 optionally include wherein the interposer is located between the passive component and one or more sides of the first or second substrate.

In Example 6, the subject matter of any one or more of Examples 1-5 optionally include wherein the interposer includes an aperture and the passive component located within the aperture of the interposer.

In Example 7, the subject matter of any one or more of Examples 1-6 optionally include wherein the passive component is attached to the second substrate.

In Example 8, the subject matter of any one or more of Examples 1-7 optionally include a die communicatively coupled to the die interface, wherein one or more contacts of the plurality of electrical contacts are subjacent to the die.

In Example 9, the subject matter of Example 8 optionally includes a second die electrically and mechanically coupled to the first or the second package.

In Example 10, the subject matter of Example 9 optionally includes wherein the second die is located between the first substrate and the second substrate.

In Example 11, the subject matter of any one or more of Examples 1-10 optionally include an integrated voltage regulator, wherein the passive component is part of the integrated voltage regulator.

Example 12 is a method of making an electronic package comprising: electrically coupling an interposer to a first substrate, the first substrate configured for communication with an electronic device; operatively coupling a passive component to a second substrate, wherein the passive component has a height; and electrically coupling the second substrate to the interposer, the passive component is located between the first substrate and the second substrate, wherein the second substrate is located at a distance from the first substrate and the height of the passive component is less than the distance.

In Example 13, the subject matter of Example 12 optionally includes wherein electrically coupling the interposer to the first substrate further comprises attaching a printed circuit board interposer to the first substrate, wherein the interposer includes a plurality of electrical connections.

In Example 14, the subject matter of any one or more of Examples 12-13 optionally include wherein electrically coupling the interposer to the first substrate further comprises forming a mold and a plurality of through-mold vias.

In Example 15, the subject matter of any one or more of Examples 12-14 optionally include wherein operatively coupling a passive component to a second substrate includes coupling the passive component to the second substrate with solder, wherein the passive component is a surface-mount passive component.

In Example 16, the subject matter of any one or more of Examples 12-15 optionally include wherein operatively coupling a passive component to a second substrate includes directly attaching the passive component to the second substrate and not directly attaching the passive component to the first substrate.

In Example 17, the subject matter of any one or more of Examples 12-16 optionally include wherein electrically coupling the second substrate to the interposer includes locating the passive component within an aperture extending through the interposer.

In Example 18, the subject matter of any one or more of Examples 12-17 optionally include wherein electrically coupling the second substrate to the interposer includes providing an air gap between the passive component and the first substrate.

In Example 19, the subject matter of any one or more of Examples 12-18 optionally include fabricating a plurality of die interfaces for communicatively coupling a die to the second substrate.

In Example 20, the subject matter of Example 19 optionally includes constructing at least one routing layer to communicatively couple at least one of the die interfaces to the passive component.

In Example 21, the subject matter of any one or more of Examples 19-20 optionally include locating a second die interface on the first surface of the second substrate.

In Example 22, the subject matter of any one or more of Examples 19-21 optionally include locating a second die interface on the first surface of the first substrate.

In Example 23, the subject matter of any one or more of Examples 12-22 optionally include forming an air core inductor in the first substrate or the second substrate.

Example 24 is an electronic package with an integrated voltage regulator located between a first substrate and a second substrate, the electronic package comprising: a first substrate including a device interface for communication with an electronic device; an interposer electrically coupled to the first substrate, wherein the interposer includes an aperture therethrough; a second substrate offset from the first substrate at a distance and electrically coupled to the first substrate through the interposer; an integrated voltage regulator including a passive component attached to the second substrate and located between the first substrate and the second substrate, wherein the passive component is located within the aperture and has a height that is less than the distance between the first substrate and the second substrate; and a die attached to the second substrate and communicatively coupled to the passive component.

In Example 25, the subject matter of Example 24 optionally includes a plurality of electrical contacts coupled to the device interface for communicating between the first substrate and the electronic device.

In Example 26, the subject matter of Example 25 optionally includes wherein one or more contacts of the plurality of electrical contacts are located subjacent to the die and the passive component.

In Example 27, the subject matter of any one or more of Examples 25-26 optionally include wherein the plurality of electrical contacts are located from a first side to the second side of the first substrate.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic package system with one or more passive components located between a first substrate and a second substrate of the electronic package, the electronic package comprising:
    the first substrate including a device interface for communication with an electronic device, a top surface and an opposing bottom surface;
    a circuit board electrically coupled to the first substrate through the device interface;
    an interposer electrically coupled to the top surface of the first substrate, the interposer including an epoxy resin or polymer and including an aperture in the interposer;
    the second substrate offset from the first substrate at a distance and electrically coupled to the first substrate through the interposer, the second substrate including an exposed top surface and an opposing bottom surface, the bottom surface of the second substrate facing the top surface of the first substrate;
    a passive component attached to one of the first substrate or the second substrate and located between the first substrate and the second substrate in the aperture, wherein the passive component has a height that is less than the distance between the first substrate and the second substrate;
    a first die attached to the top surface of the second substrate and communicatively coupled to the passive component; and
    a second die attached to the bottom surface of the first substrate, the second die situated coplanar with solder interconnects directly connected between the device interface and the circuit board.

2. The electronic package of claim 1, further comprising a plurality of first electrical contacts coupled to the device interface for communicating between the first substrate and the electronic device, wherein one or more contacts of the plurality of electrical contacts are located subjacent to the passive component.

3. The electronic package of claim 1, further comprising a plurality of second electrical contacts coupled to the device interface for communicating between the first substrate and the electronic device, wherein the plurality of electrical contacts are located from a first side to a second side of the first substrate.

4. The electronic package of claim 1, wherein the interposer is located between the passive component and one or more sides of the first or second substrate.

5. The electronic package of claim 1, wherein the passive component is directly attached to the second substrate.

6. The electronic package of claim 1, further comprising a third die electrically and mechanically coupled to the first or the second substrate.

7. The electronic package of claim 6, wherein the third die is located between the first substrate and the second substrate.

8. The electronic package of claim 1, further comprising, an integrated voltage regulator, wherein the passive component is part of the integrated voltage regulator.

9. An electronic package system with an integrated voltage regulator located between a first substrate and a second substrate, the electronic package comprising:

the first substrate including a device interface for communication with an electronic device, a top surface and an opposing bottom surface;

a circuit board electrically coupled to the first substrate through the device interface;

an interposer electrically coupled to the first substrate, wherein the interposer includes an aperture therethrough, the interposer including an epoxy resin or polymer and including an aperture;

the second substrate offset from the first substrate at a distance and electrically coupled to the first substrate through the interposer, the second substrate including an exposed top surface and an opposing bottom surface, the bottom surface of the second substrate facing the top surface of the first substrate;

an integrated voltage regulator including a passive component attached to the bottom surface of the second substrate and located between the first substrate and the second substrate, wherein the passive component is located within the aperture and has a height that is less than the distance between the first substrate and the second substrate;

a first die attached to the top surface of the second substrate and communicatively coupled to the passive component; and a second die attached to the bottom surface of the first substrate, the second die situated coplanar with solder interconnects directly connected between the device interface and the circuit board.

10. The electronic package of claim 9, further comprising a plurality of electrical contacts coupled to the device interface for communicating between the first substrate and the electronic device, wherein one or more contacts of the plurality of electrical contacts are located subjacent to the die and the passive component.

11. The electronic package of claim 10, wherein the plurality of electrical contacts are located from a first side to a second side of the first substrate.

* * * * *